(12) United States Patent
Hosokawa et al.

(10) Patent No.: US 7,240,551 B2
(45) Date of Patent: Jul. 10, 2007

(54) SENSOR STEM, SENSOR DEVICE HAVING THE SAME, AND METHOD OF MANUFACTURING SENSOR DEVICE

(75) Inventors: Toshinobu Hosokawa, Sannohe (JP); Masanori Yachi, Sannohe (JP); Kazuhiro Ota, Sannohe (JP)

(73) Assignee: Fujitsu Media Devices Limited, Yokohama (JP)

( * ) Notice: Subject to any disclaimer, the term of this patent is extended or adjusted under 35 U.S.C. 154(b) by 214 days.

(21) Appl. No.: 11/053,670

(22) Filed: Feb. 9, 2005

(65) Prior Publication Data

US 2005/0172713 A1 Aug. 11, 2005

(30) Foreign Application Priority Data

Feb. 10, 2004 (JP) .............................. 2004-034315

(51) Int. Cl.
*G01P 1/02* (2006.01)
(52) U.S. Cl. .......................................... 73/493; 73/431
(58) Field of Classification Search .................. 73/493, 73/431, 504.04, 504.12, 1.37–1.38, 1.77–1.78, 73/514.32
See application file for complete search history.

(56) References Cited

U.S. PATENT DOCUMENTS

| 3,726,987 | A | | 4/1973 | Pryor et al. | |
| 6,094,984 | A | * | 8/2000 | Asano et al. | 73/493 |
| 6,708,564 | B2 | * | 3/2004 | Ishikawa et al. | 73/493 |
| 6,810,735 | B2 | * | 11/2004 | Kaneko et al. | 73/493 |

FOREIGN PATENT DOCUMENTS

DE 44 14 266 A1 10/1995
JP 6-58369 3/1994

* cited by examiner

*Primary Examiner*—Helen Kwok
(74) *Attorney, Agent, or Firm*—Arent Fox, LLP

(57) ABSTRACT

A sensor stem supporting a sensor element comprising a metal plate having a shape defined by press, the metal plate include a dent portion formed on a first surface of the metal plate, a step portion formed on a second surface of the metal plate facing the first surface, and a projection formed on the step portion for resistance welding. It is thus possible to obtain an excellent hermetic sealing of the sensor stem and a cap, which protects an oscillator, a circuit board and the like. The sensor stem can prevent a short circuit and can be lowered in height thereof.

5 Claims, 6 Drawing Sheets

-- PRIOR ART --

SENSOR STEM, SENSOR DEVICE HAVING THE SAME, AND METHOD OF MANUFACTURING SENSOR DEVICE

BACKGROUND OF THE INVENTION

1. Field of the Invention

This invention generally relates to a sensor device such as a gyro sensor or an acceleration sensor used for detecting angular velocity on a car navigation system or the like, and more particularly, to a stem structure of the sensor device. The present invention also relates to a manufacturing method of the sensor device.

2. Description of the Related Art

Conventionally, acceleration sensors and angular velocity sensors (gyro sensors) having various types of configuration have been proposed. Japanese Patent Application Publication No. 6-58369 (hereinafter referred to as Document 1) describes an acceleration sensor shown in FIG. 1. The acceleration sensor 1 includes a base plate 11, a sensor chip 3, a cap 8, and lead terminals 5. The sensor chip 3 is mounted on a circuit board provided on the base plate 11. The cap 8 seals the sensor chip 3. The lead terminals 5 penetrate the base plate 11. Additionally, the acceleration sensor includes electronic components 4 and lead wires 7 on the circuit board. The lead wires 7 connect the circuit board and the lead terminals 5.

The base plate 11 forms a stem of the acceleration sensor and includes a dent portion 13 and a step portion 12. The above-mentioned base plate 11 is formed with embossing press (folding press). That is to say, the dent portion 13 is formed by pressing up a plane plate, and then the step portion 12 is formed by pressing up from the opposite side of the plane plate. The cap 8 is attached to the base plate 11 by hermetically sealing a flange 9 of the cap 8 with a circumference of the base plate 11 by resistance welding, with fitting together with the step portion 12 of the base plate 11.

Document 1 discloses that the cap 8 is attached by the resistance welding; however, the detail is not described. It is known that there are various kinds of resistance welding, and for instance, projection welding is preferable in order to achieve an excellent hermetic sealing. However, the base plate 8, to which the flange 9 of the cap 8 is welded, is plane, so the projection welding cannot be employed.

The base plate 11 is formed by embossing press. This makes it impossible to obtain a sufficient height of the step portion 12 to serve as a protective barrier against welding spatters.

SUMMARY OF THE INVENTION

The present invention has been made in view of the above circumstances and provides a sensor stem, a sensor device including the sensor stem, and a manufacturing method of the sensor device including the sensor stem. The sensor stem has a structure of an excellent hermetic sealing and has a sufficient height to serve as a protective barrier against welding spatters, and in addition, the sensor stem can be lowered.

According to an aspect of the present invention, preferably, there is provided a sensor stem supporting a sensor element comprising a metal plate having a shape defined by press, the metal plate including a dent portion formed on a first surface of the metal plate, a step portion formed on a second surface of the metal plate facing the first surface, and a projection formed on the step portion for resistance welding.

According to another aspect of the present invention, preferably, there is provided a sensor device including a sensor element, lead terminals, a cap, and a sensor stem. The sensor stem supports the sensor element and the lead terminals, and is welded together with the cap. The sensor stem may include a metal plate having a shape defined by press, the metal plate including a dent portion formed on a first surface of the metal plate, a step portion formed on a second surface of the metal plate facing the first surface, and a projection formed on the step portion for resistance welding.

According to still another aspect of the present invention, preferably, there is provided a method of manufacturing a sensor device including steps of forming a sensor stem by pressing a metal plate into a dent portion provided on a first surface, a step portion provided on a second surface facing the first surface, and a projection provided on the step portion for resistance welding at the same time, attaching a sensor element on the sensor stem, and welding a cap to the sensor stem.

In accordance with the present invention, the sensor stem includes a dent portion formed on the first surface of the metal plate. It is thus possible to prevent a short circuit between the lead soldered to the printed circuit board and the sensor stem provided on the printed circuit board caused resulting from the solder entering between a bottom face of the sensor stem and the printed circuit board. In addition, the sensor stem includes the step portion formed on the second surface facing the first surface, and the step portion serves as a barrier layer against the welding spatters. It is thus possible to keep precision apparatuses such as the sensor element clean, the precision apparatuses being mounted on the sensor stem. Further, the step portion includes the projection to improve the hermetic and stable sealing.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
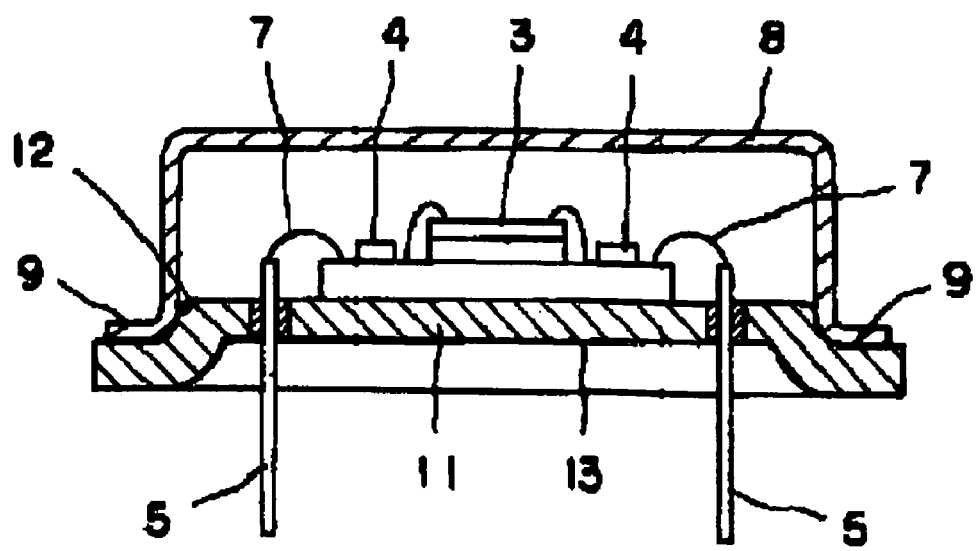
FIG. 1 illustrates a conventional sensor stem.
Figure 2A:
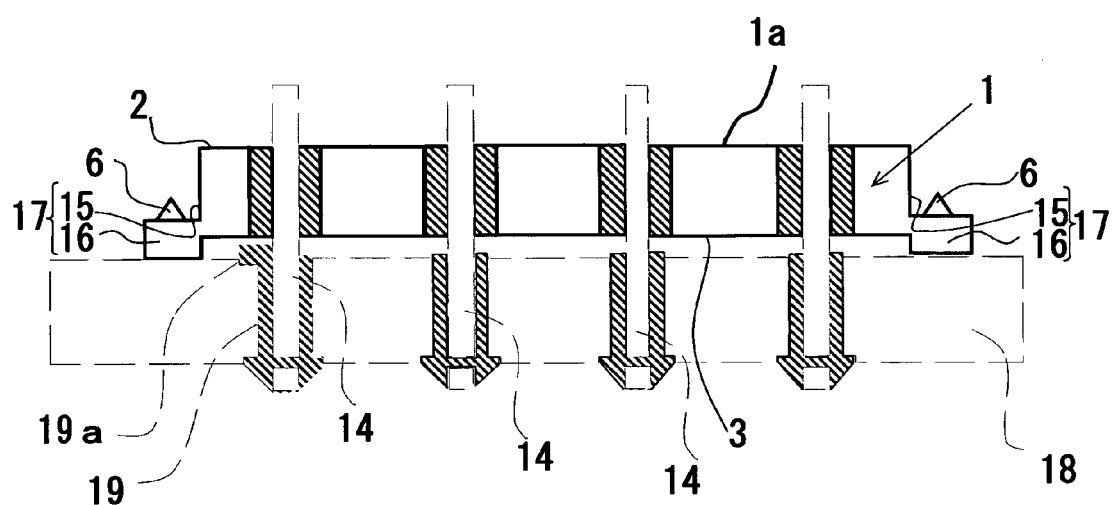
FIG. 2A is a cross-sectional view of a sensor stem in accordance with a first embodiment of the present invention.
Figure 2B:
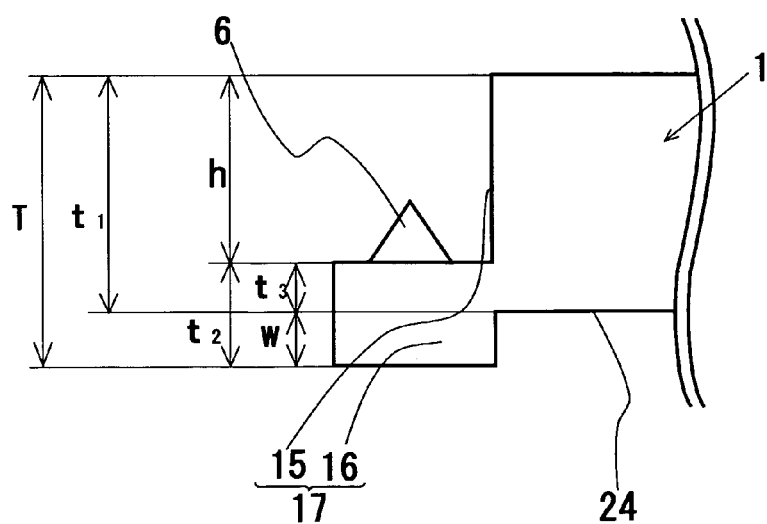
FIG. 2B is an enlarged view of the sensor stem shown in FIG. 2A and dimensions thereof.
Figure 4:
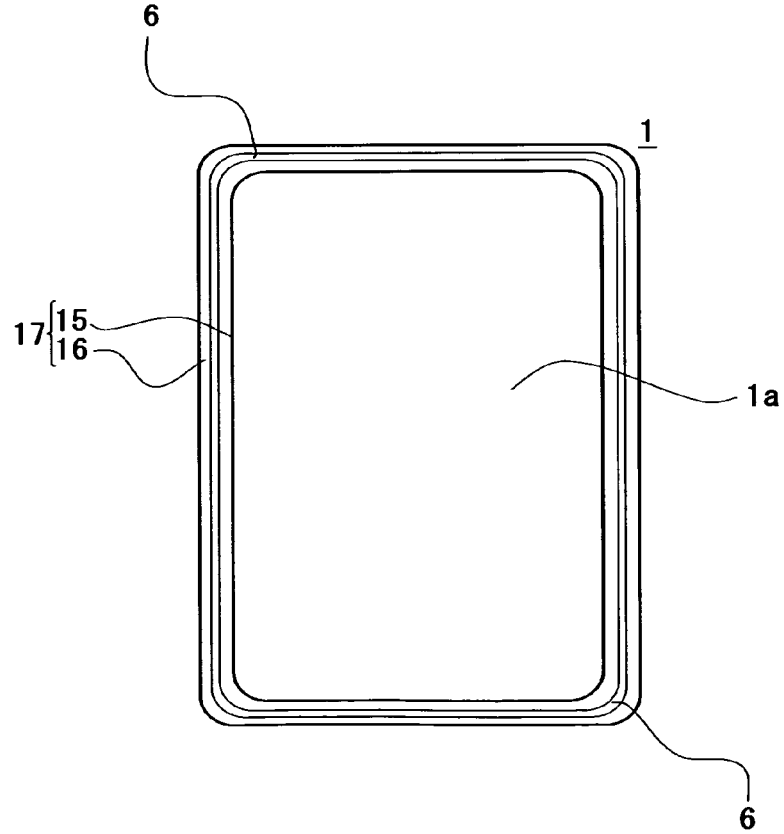
FIG. 4 illustrates a projection provided on the sensor stem in accordance with the first embodiment of the present invention.

A sensor stem 1 has a stem structure formed by pressing a soft metal plate 2 into shapes with a high pressure (high pressure pressing) in accordance with a first embodiment of the present invention. The metal plate 2 is nickel-plated. Referring to FIG. 2A, the sensor stem 1 includes a dent portion 24, a step portion 17, and a projection 6. The dent portion 24 is formed on a first surface (bottom face) of the metal plate 2. The step portion 17 is formed on a top face facing the first surface. As shown in FIGS. 2A and 2B, the step portion 17 includes an external wall 15 and a first flange 16. The step portion 17 is provided on the whole circumference of the metal plate 2. Referring to FIG. 4, the projection 6 is provided on the whole circumference of the first flange 16 of the step portion 17.

Referring to FIG. 2B, to take an example of dimensions of the thickness of each part in the sensor stem 1, a total thickness T is 1.2 mm, a plate thickness $t_1$ of the dent portion 24 is 1.0 mm, a height h of the external wall 15 of the step portion 17 is 0.8 mm, a plate thickness $t_2$ of the first flange 16 is 0.4 mm, a plate thickness $t_3$ in which the external wall 15 and the first flange 16 are connected is 0.2 mm, and a depth w of the dent portion 24 is 0.2 mm.

The sensor stem 1 having the above-mentioned configuration has the stem structure into which the metal plate is pressed and formed with the high-pressure press, as described. With the high-pressure press, the dent portion 24, the step portion 17, and the projection 6 can be formed in the same process.

Figure 3:
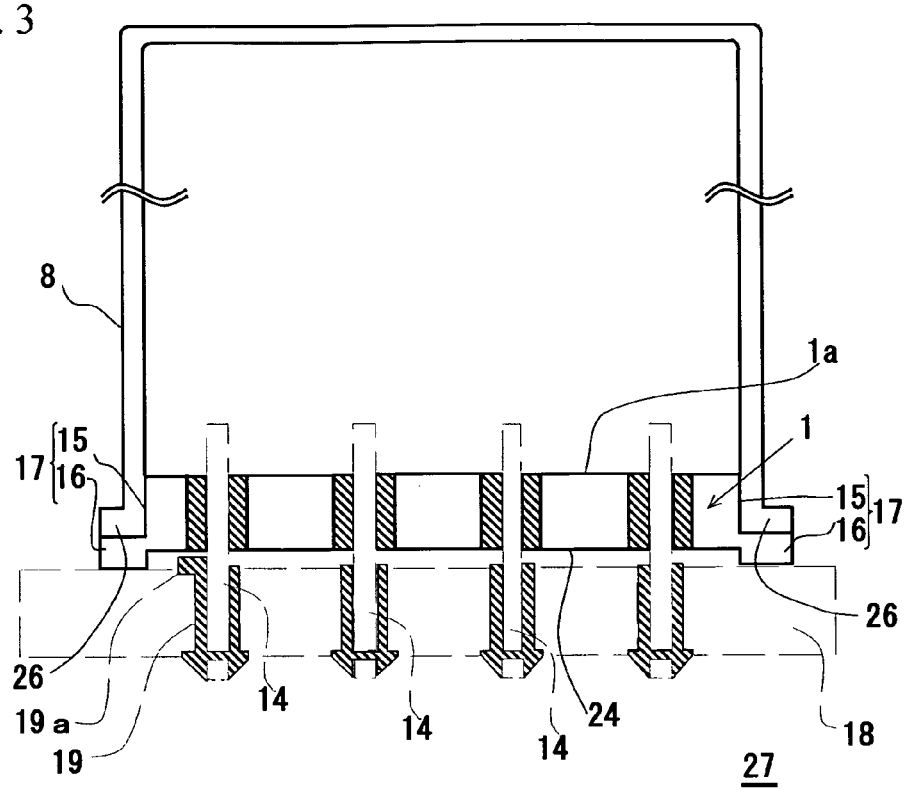
FIG. 3 is a cross-sectional view of a sensor device in accordance with a second embodiment of the present invention.

A reference numeral 18 shown in FIGS. 2A and 3 denotes a printed circuit board, a reference numeral 14 denotes a lead terminal, and reference numerals 19 and 19a shown as hatching denote solders.

The dent portion 24 of the sensor stem 1 is pressed by the depth w from the original thickness of the metal plate 2, as shown in FIG. 2B. Thus, a standoff having the depth w can be formed in the dent portion 24.

Figure 8:
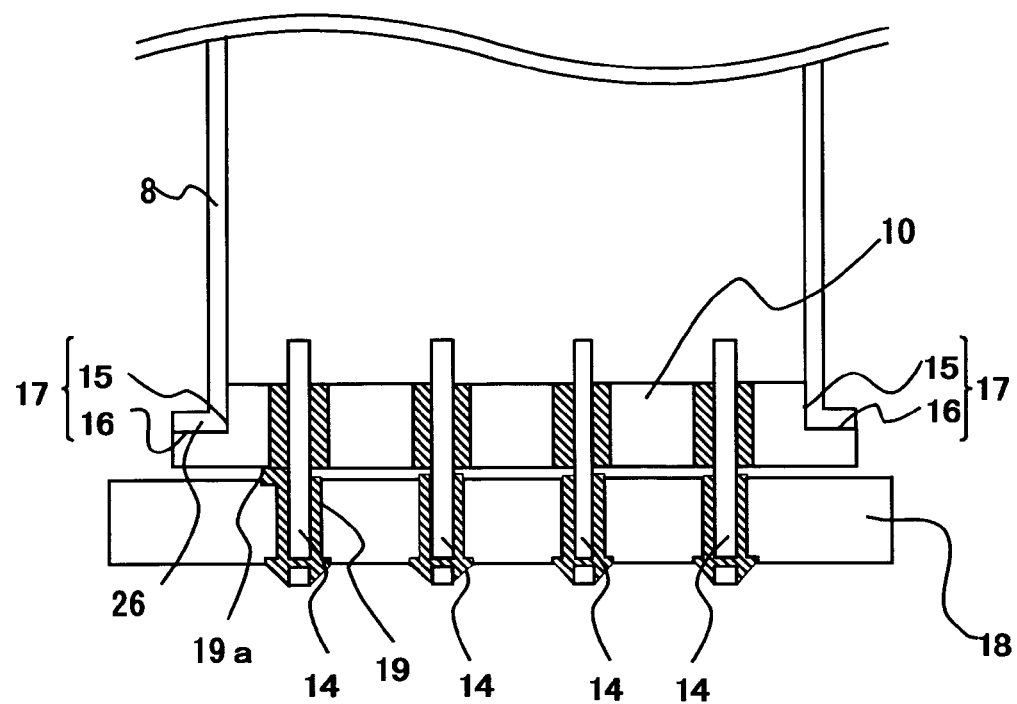
FIG. 8 is a cross-sectional view of the sensor stem 10 on which welded cap is welded.

FIG. 8 shows the sensor stem 10 mounted on the printed circuit board 18 without the standoff. In this configuration, the solder 19a enters between a bottom face of the sensor stem 10 and the printed circuit board 18. The solder 19a might short-circuit the sensor stem 10 and the lead terminals 14. Therefore, the standoff is formed by arranging the dent portion 24, and it is thus possible to prevent the short circuit caused resulting from the solder 19a that enters between a bottom face of the sensor stem 1 and the printed circuit board 18.

Figure 9:
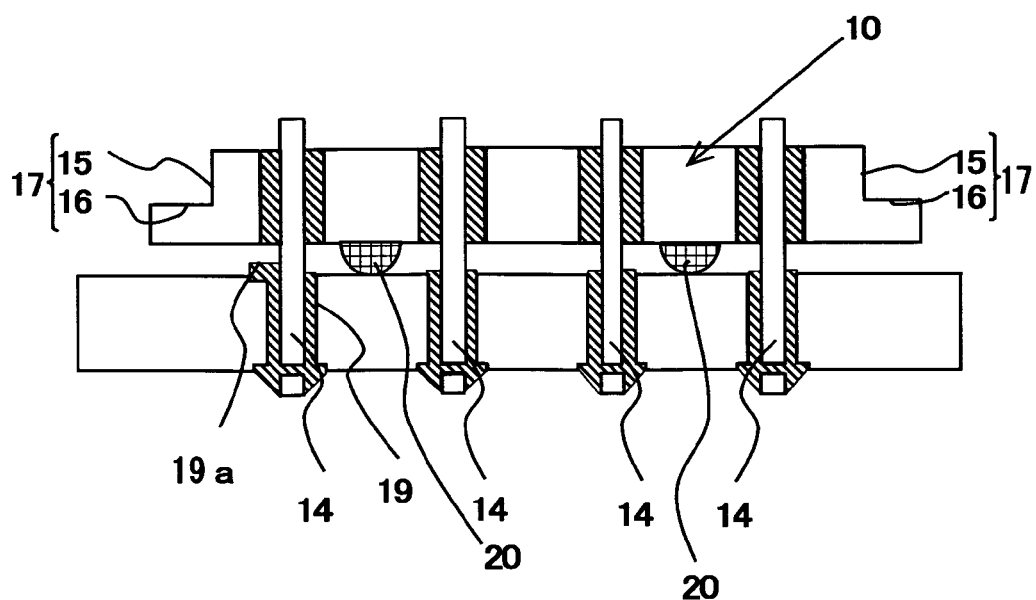
FIG. 9 is a cross-sectional view having a standoff with protrusions on a bottom face of the sensor stem.

Referring to FIG. 9, another standoff structure is available by attaching protrusions 20 on the bottom face of the sensor stem 10. However, there is a disadvantage in that the sensor stem 10 becomes higher by the height of the protrusion 20 in the standoff structure, to which the protrusions 20 are attached without forming the dent portion on the bottom face of the sensor stem 10, as shown in FIG. 9.

The sensor stem 1 in accordance with the first embodiment of the present invention has the thickness $t_1$ forming the dent portion 24 to be thinner than that of a central part of the sensor stem 10 shown in FIGS. 8 and 9. It is thus possible to arrange the total thickness T of the sensor stem 1 to be identical to the total thickness of the sensor stem 10 and provide the standoff for preventing the short circuit between the sensor stem 1 and the printed circuit board 18.

The metal plate formed into the sensor stem 1 originally had a uniform thickness, and it is hard to form the sensor stem 1 to have different parts in thickness by low-pressure pressing. In accordance with the first embodiment of the present invention, the high-pressure pressing with a certain degree of pressure is capable of having different shapes and dimensions in the thickness t1 included in the dent portion 24 and the thickness t2 of the first flange 16.

A circuit board 23 or the like (with reference to FIG. 7) is mounted on the sensor stem 1, and the cap 8 is attached by welding as shown in FIG. 3. The sensor stem 1 includes the projection 6. The projection 6 is provided to bond the sensor stem 1 with the cap 8 by projection welding and obtain the hermetic sealing after welding. On this purpose, the projection 6 is formed on the whole circumference of the first flange 16 of the step portion 17 provided on the whole circumference of the metal plate 2 (shown in FIG. 4). The projection 6 is formed to crush a part of the first flange 16 by the high-pressure pressing.

The external wall 15 of the step portion 17 serves as the protective barrier against the welding spatters when the cap 8 is welded with the sensor stem. The external wall 15 retains a sufficient height as the protective barrier by the high-pressure press.

Second Embodiment

A second embodiment of the present invention will describe the welding method of the sensor stem 1 and the cap 8 with the projection 6.

A second embodiment of the present invention will be described with reference to FIGS. 3 and 7. A sensor device 27 in accordance with the second embodiment of the present invention is shown in FIGS. 3 and 7.

The sensor device 27 includes the sensor stem 1 in accordance with the first embodiment of the present invention, a sensor element 22, the lead terminals 14, and the cap 8. The sensor element 22 and the lead terminals 14 are supported by the sensor stem 1. The cap 8 is welded with the sensor stem 1. The sensor element 22 is a tuning fork oscillator and is capable of detecting the angular velocity. Therefore, the sensor device in accordance with the second embodiment of the present invention is an angular velocity sensor device (gyro sensor device).

Figure 7:
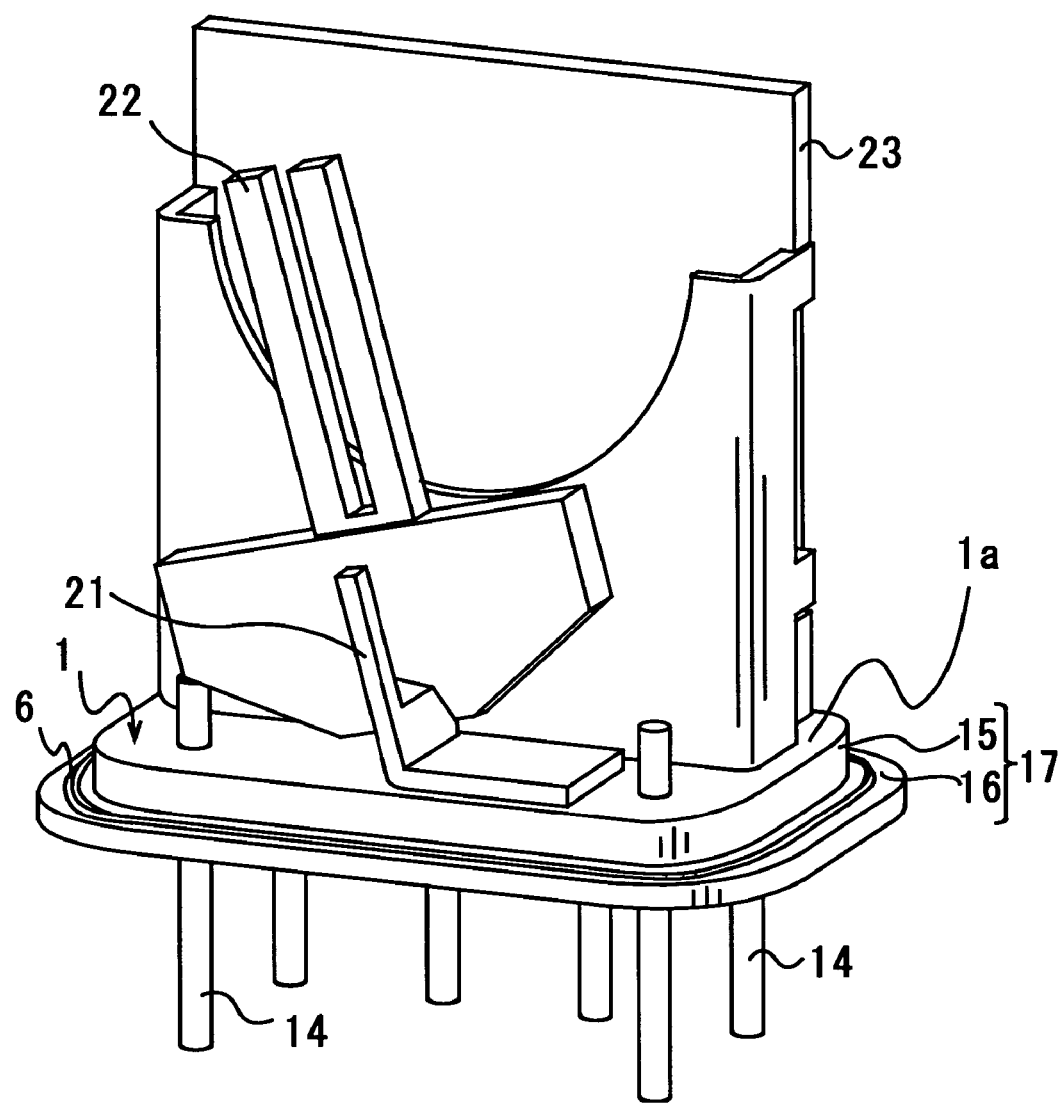
FIG. 7 is a perspective view of an angular velocity sensor having an oscillator, sensor element and the like mounted on the sensor stem.

Referring to FIG. 7, an oscillator supporting portion 21, an oscillator 22, the circuit board 23, and multiple lead terminals (external connection terminals) 14 are mounted on a top face 1a of the sensor stem 1. The oscillator supporting portion 21 supports the oscillator 22. The lead terminals 14 are soldered on the printed circuit board 18 as shown in the reference numeral 19 in FIG. 3. Ends of the lead terminals penetrate the sensor stem 1 and are connected to the circuit board 23 mounted on the sensor stem 1. The cap 8 is attached on the sensor stem 1 on which the circuit board 23 is mounted, as shown in FIG. 3. The above-mentioned sensor device is mounted on the printed circuit board 18. The oscillator 22 and the circuit board 23 are not shown in FIG. 3.

The above-mentioned sensor device 27 is manufactured as follows.

First, the sensor stem is produced in accordance with the first embodiment of the present invention. That is, the dent portion 24, the step portion 17 provided on a second surface facing the first surface, and the projection 6 provided on the step portion 17 for resistance welding are formed by pressing at the same time to obtain the sensor stem 1. Next, necessary processes are performed on the sensor stem 1 such as drilling to mount the sensor element or the like on the sensor stem 1. The sensor device shown in FIG. 7 is thus obtained. Then, the cap 8 is welded to the sensor stem 1. The sensor device shown in FIG. 3 is thus obtained.

Here, a description will be given of how to weld the cap 8. The projection welding is conducted. The cap 8 is made of a nickel-plated steel plate. A second flange 26 is formed along the circumference on a bottom face of the cap 8, as shown in FIG. 3. The second flange 26 of the cap 8 and the first flange 16 of the sensor stem 1 are brought into contact and welded together.

The sensor stem 1 has the step portion 17 provided on the whole circumference of the metal plate 2, as described in the first embodiment of the present invention. The projection 6 is formed on the first flange 16 of the step portion 17. The projection 6 is used for welding the sensor stem 1 and the cap 8 by projection welding, and thus the hermetic sealing can be achieved after welding. Preferably, in order to achieve the hermetic sealing, as shown in FIG. 4, the projection 6 is formed on the whole circumference of the flange 16 on the step portion 17, which is also formed on the whole circumference of the metal plate 2.

Figure 5:
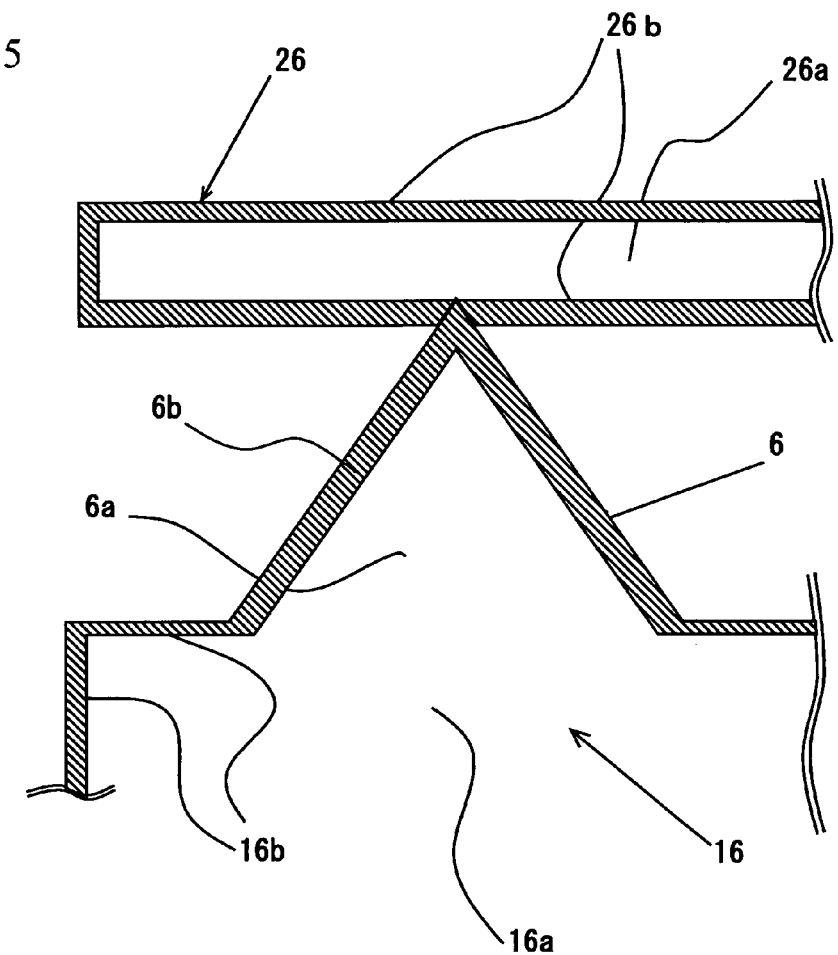
FIG. 5 is an enlarged cross-sectional view of the projection and a flange of a cap, when the cap is welded with the flange of the sensor stem.

A description will be given of a welding procedure. First, the cap 8 is attached on the sensor stem 1 so that an inner circumference on the bottom of the cap 8 may be in close contact with the external wall 15 of the step portion 17 in the sensor stem 1. Here, referring to FIG. 5, an upper end of the projection 6 is attached firmly to a bottom face of the second flange 26. In FIG. 5, a reference numeral 16a denotes an iron layer of the first flange 16 on the sensor stem 1. A reference numeral 16b denotes a nickel-plated layer of the first flange 16 on the sensor stem 1. A reference numeral 6a is an iron layer of the projection 6. A reference numeral 6b denotes a nickel-plated layer of the projection 6. A reference numeral 26a denotes an iron layer of the second flange 26 on the cap 8. A reference numeral 26b denotes a nickel-plated layer of the second flange 26 on the cap 8.

Referring to FIG. 5, the upper end of the projection 6 is attached firmly to the bottom face of the second flange 26 to start the projection welding. Then, the iron layer 6a and the nickel-plated layer 6b of the projection 6 start melting. The welding is thus developed, and welded iron layer 6a and the nickel-plated layer 6b are mixed and the mixed molten iron layer 6a and the nickel-plated layer 6b spread widely on the whole top face of the first flange 16 in the sensor stem 1. Thus, the projection 6 gradually collapses and disappears.

Figure 6:
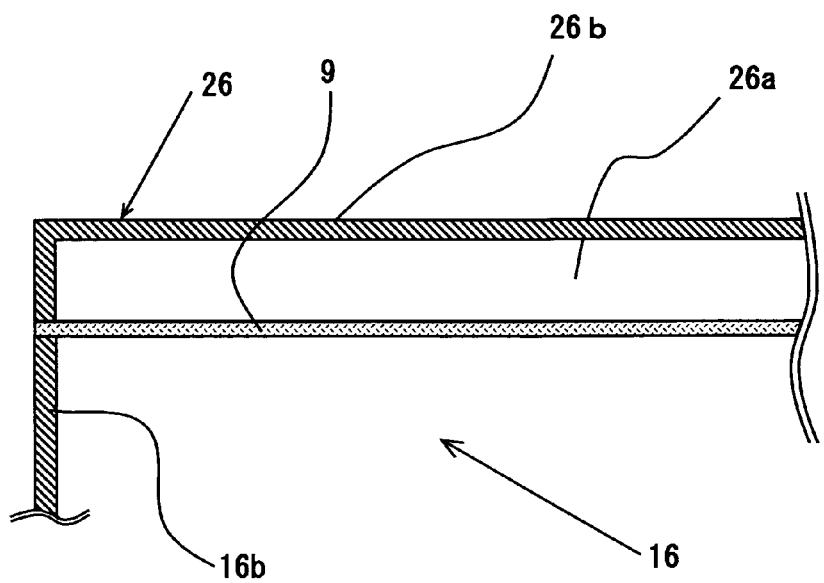
FIG. 6 is an enlarged cross-sectional view of a welded area after the cap is welded together with the flange of the sensor stem.

The welding is further developed, and finally, part of the iron layer 26a and the nickel-plated layer 26b provided on the bottom face of the second flange 26 in the cap 8 and part of the iron layer 16a and the nickel-plated layer 16b provided on the top face of the sensor stem 1 are melted and mixed together. Referring to FIG. 6, a metal alloy layer 9 is formed, and thus the welding is completed.

The projection 6, referring back to FIG. 4, is formed on the whole circumference of the sensor stem 1. The metal alloy layer 9 is also formed on the whole circumference of the sensor stem 1. Thus, the cap 8 is hermetically sealed with the sensor stem 1, and the hermetic sealing is kept stable. Thus, the oscillator, the circuit board, and the like mounted on the top face of the sensor stem 1 can be protected and kept clean.

The cap 8 is firmly attached to the sensor stem 1 so that the inner circumference on the bottom of the cap 8 may be in close contact with the external wall 15 of the step portion 17 in the sensor stem 1. The external wall 15 serves as the protective barrier against the welding spatters.

A sufficient height is obtained in the external wall 15 by the high-pressure pressing to serve as the protective barrier as described above. Thus, the oscillator, the circuit board, and the like mounted on a top face 1a of the sensor stem 1 are not contaminated by the welding spatters.

Thus produced sensor device 27 is mounted on the printed circuit board 18, as shown in FIG. 3, and then is mounted on the car navigation system.

The present invention is not limited to the above-mentioned embodiments, and other embodiments, variations and modifications may be made without departing from the scope of the present invention.

The present invention is based on Japanese Patent Application No. 2004-034315 filed on Feb. 10, 2004, the entire disclosure of which is hereby incorporated by reference.

What is claimed is:

1. A sensor stem supporting a sensor element comprising a metal plate having a shape defined by a high pressure press, the metal plate including:
   a dent portion formed on a first surface of the metal plate;
   a step portion formed on a second surface of the metal plate opposite to the first surface, the step portion defining a dent on the first surface together with the dent portion so as to surround the dent; and
   a projection formed on the step portion for resistance welding,
   the step portion including an external wall and a flange on which the projection is provided,
   the dent portion having a thickness different than a thickness of the flange.

2. The sensor stem as claimed in claim 1, wherein the projection is formed on a whole circumference of the step portion provided on a whole outer circumference of the metal plate.

3. A sensor device comprising:
   a sensor element;
   lead terminals;
   a cap; and
   a sensor stem,
   wherein:
   the sensor stem supports the sensor element and the lead terminals, and is welded together with the cap;
   the sensor stem comprises a metal plate having a shape defined by a high pressure press, the metal plate including:
   a dent portion formed on a first surface of the metal plate; and
   a step portion formed on a second surface of the metal plate opposite to the first surface, the step portion defining a dent on the first surface together with the dent portion so as to surround the dent,
   the step portion including an external wall and a flange to which the cap is fixed by resistance-welding with a projection provided on the flange,
   the dent portion having a thickness different from a thickness of the flange.

4. The sensor device as claimed in claim 3, wherein the sensor element detects at least one of acceleration and angular velocity.

5. A method of manufacturing a sensor device comprising:
   forming a sensor stem by high pressure pressing a metal plate into a dent portion provided on a first surface, a step portion provided on a second surface facing the first surface, and a projection provided on the step portion for resistance welding at the same time, the step portion defining a dent on the first surface together with the dent portion so as to surround the dent, the step portion including an external wall and a flange on which the projection is provided, the dent portion having a thickness different from a thickness of the flange;

attaching a sensor element on the sensor stem; and resistance-welding a cap to the sensor stem with the projection.

* * * * *